United States Patent
Chann et al.

(10) Patent No.: US 8,553,327 B2
(45) Date of Patent: Oct. 8, 2013

(54) SELECTIVE REPOSITIONING AND ROTATION WAVELENGTH BEAM COMBINING SYSTEM AND METHOD

(75) Inventors: Bien Chann, Merrimack, NH (US); Robin Huang, North Billerica, MA (US)

(73) Assignee: Teradiode, Inc., Wilmington, MA (US)

(*) Notice: Subject to any disclaimer, the term of this patent is extended or adjusted under 35 U.S.C. 154(b) by 99 days.

(21) Appl. No.: 13/042,042

(22) Filed: Mar. 7, 2011

(65) Prior Publication Data
US 2011/0216417 A1 Sep. 8, 2011

Related U.S. Application Data

(60) Provisional application No. 61/310,777, filed on Mar. 5, 2010, provisional application No. 61/310,781, filed on Mar. 5, 2010, provisional application No. 61/417,394, filed on Nov. 26, 2010.

(51) Int. Cl.
G02B 27/64 (2006.01)
(52) U.S. Cl.
USPC .......................................... 359/556; 359/621
(58) Field of Classification Search
USPC .......................................... 359/556
See application file for complete search history.

(56) References Cited

U.S. PATENT DOCUMENTS

| | | | |
|---|---|---|---|
| 6,044,096 A | 3/2000 | Wolak et al. | |
| 6,192,062 B1 | 2/2001 | Sanchez-Rubio et al. | |
| 6,327,292 B1 * | 12/2001 | Sanchez-Rubio et al. | 372/92 |
| 6,356,576 B1 | 3/2002 | Smith | |
| 8,049,966 B2 | 11/2011 | Chann | |
| 2004/0095983 A1 | 5/2004 | Whitley | |
| 2004/0174604 A1 | 9/2004 | Brown | |
| 2004/0252744 A1 | 12/2004 | Anikitchev et al. | |
| 2006/0126690 A1 | 6/2006 | Kido et al. | |
| 2007/0002925 A1 | 1/2007 | Zediker | |
| 2007/0127123 A1 * | 6/2007 | Brown et al. | 359/556 |

FOREIGN PATENT DOCUMENTS

JP 2007165624 A1 6/2007

* cited by examiner

Primary Examiner — James Jones
(74) Attorney, Agent, or Firm — Ascentage Law, PLLC

(57) ABSTRACT

A system and method for reconfiguring a plurality of electromagnetic beams to take advantage of various wavelength beam combining techniques. The reconfiguring of beams includes individual rotation and selective repositioning of one or more beams with respect to beam's original input position.

17 Claims, 13 Drawing Sheets

SELECTIVE REPOSITIONING AND ROTATION WAVELENGTH BEAM COMBINING SYSTEM AND METHOD

CROSS-REFERENCE TO RELATED APPLICATIONS

This application claims priority under 35 U.S.C. §119 to the following U.S. Provisional Patent Applications, each of which is hereby incorporated by reference in its entirety: U.S. Ser. No. 61/310,777 filed Mar. 5, 2010; U.S. Ser. No. 61/310,781 filed Mar. 5, 2010, and U.S. Ser. No. 61/417,394 filed Nov. 26, 2010.

BACKGROUND OF THE INVENTION

1. Field of the Invention

The present embodiments relate generally to laser systems and more particularly to wavelength beam combining systems and methods.

2. Description of the Prior Art

Wavelength beam combining (WBC) is a method for scaling the output power and brightness from laser diode bars, stacks of diode bars, as well as other lasers arranged in one or two-dimensional array.

WBC methods have been developed to combine beams along the slow dimension of each emitter as well as the fast dimension of each emitter. See for example, U.S. Pat. Nos. 6,192,062, 6,208,679 and 2010/0110556 A1. In prior patents, U.S. Pat. Nos. 6,192,062 and 6,208,679, beam combining is performed along the array dimension. As such, the external cavity is more sensitive to imperfections in the laser elements. Furthermore, when broad-area laser elements are used the spectral utilization is poor. In prior art 2010/0110556 A1 beam combining is performed along the stacking dimension. In such implementations the external-cavity is much less sensitive to imperfections in laser elements. Furthermore, since beam combining is performed along the stacking dimension or near diffraction-limited dimension spectral utilization is high. However, one of the main drawbacks of this implementation is the output beam quality is limited to the beam quality of a single beam combining element or a single bar. Typical COTS bars have 19 to 49 emitters. A typical 19-emitter bar can only couple into 200 μm/0.22 NA fiber or at best 100 μm/0.22 NA fiber. The brightness of such a system is barely adequate for some applications like industrial laser cutting of thin and thick sheet metal, including stainless steel, mild steel, aluminum, and copper. Diode laser bars with a lower number of emitters are desired for better output beam quality. However, they are less readily available at a much higher cost per unit of output power as compared with standard diode laser bars. Within the prior art these individual emitters are assumed to be pre-aligned or fixed in position and as such, the output beam profile generated from combining across one of these dimensions is a result of this pre-alignment or fixed positioning of the array of emitters. This application addresses manipulating individual, one-dimensional, two-dimensional, as well as randomly placed emitters into a preferred alignment conducive to generating a preferred output beam profile. The result is more robust, and much higher spatial brightness can be obtained using COTS diode laser bars and stacks with a large number of laser elements (19 to 49 per bar or higher). Additional benefits will become apparent in the detailed description of the application.

The following application seeks to solve the problems stated.

SUMMARY OF THE INVENTION

Optical and mechanical means have been developed to selectively rotate and/or selectively reposition emitted electromagnetic beams into a desired orientation and/or pattern in a one-dimensional or two-dimensional array for use with various wavelength beam combining systems and methods.

In particular, these systems and methods are applicable to emitters that have a fixed-position relative to other emitters.

DETAILED DESCRIPTION OF THE PREFERRED EMBODIMENT

Aspects and embodiments relate generally to the field of scaling laser sources to high-power and high-brightness using an external cavity and, more particularly, to methods and apparatus for external-cavity beam combining using both one-dimensional or two-dimensional laser sources. In one embodiment the external cavity system includes one-dimensional or two-dimensional laser elements, an optical system, a dispersive element, and a partially reflecting element. An optical system is one or more optical elements that perform two basic functions. The first function is to overlap all the laser elements along the beam combining dimension onto a dispersive element. The second function is to make sure all the elements along the non beam combining dimension are propagating normal to the output coupler. Care must be taken to ensure that the optical system introduces as little loss as possible. As such, these two functions will enable a single resonance cavity for all the laser elements. In another embodiment the WBC external cavity system includes wavelength stabilized one-dimensional or two-dimensional laser elements, an optical system, and a dispersive element. One-dimensional or two-dimensional wavelength stabilized laser elements, with unique wavelength, can be accomplished using various means such as laser elements with feedback from wavelength chirped Volume Bragg grating, distributed feedback (DFB) laser elements, or distributed Bragg reflector (DBR) laser elements. Here the main function of the optical system is to overlap all the beams onto a dispersive element. Since there is no output coupler mirror external to the wavelength-stabilized laser element, having parallel beams along the non beam-combining dimension is less important. Aspects and embodiments further relate to high-power and/or high-brightness multi-wavelength external-cavity lasers that generate an overlapping or coaxial beam from very low output power to hundreds and even to megawatts of output power.

In particular, aspects and embodiments are directed to a method and apparatus for manipulating the beams emitted by the laser elements of these external-cavity systems and combining them using a WBC method to produce a desired output profile. Wavelength beam combining methods have been developed to combine asymmetrical beam elements across their respective slow or fast axis dimension. One advantage this invention seeks to provide is the ability to selectively-reconfigure input beams either spatially or by orientation to be used in slow and fast axis WBC methods, as well as a hybrid of the two. Another advantage is to selectively-reconfigure input beams when there is a fixed-position relationship to other input beams.

Figure 1A:
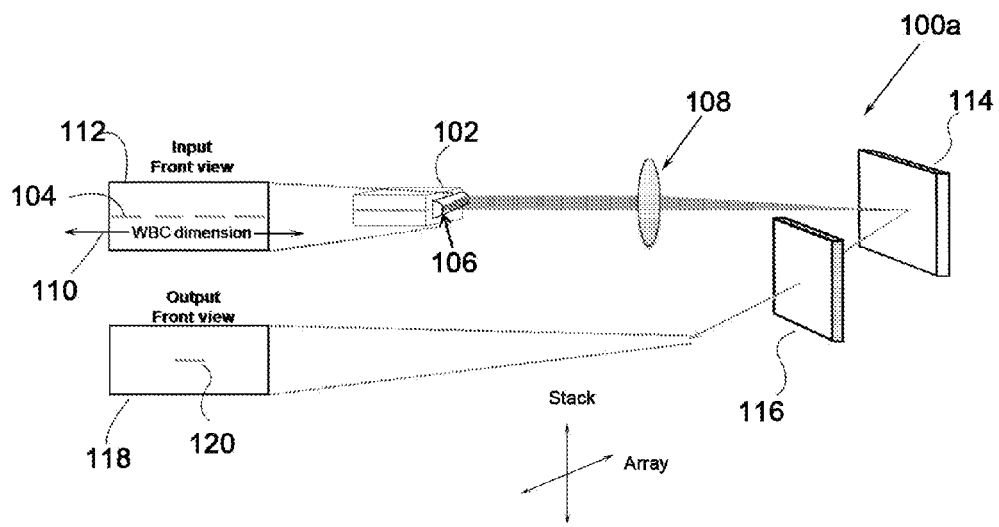
FIG. 1A is a schematic of a wavelength beam combining (WBC) method along the array dimension of a single row of emitters.

FIG. 1A illustrates a basic WBC architecture. This is the basis of U.S. Pat. Nos. 6,192,062, 6,208,679. In this particular illustration, WBC is performed along the array dimension or slow dimension for broad-area emitters. Individual beams 104 are illustrated in the figures by a dash or single line, where the length or longer dimension of the beam represents the array dimension or slow diverging dimension for broad-area emitters and the height or shorter dimension represents the fast diverging dimension. (See also left side of FIG. 8). In this related art, a diode bar 102 having four emitters is illustrated. The emitters are aligned in a manner such that the slow dimension ends of each emitted beam 104 are aligned to one another side by side along a single row—sometimes referred to as an array. However, it is contemplated that any lasing elements may be used and in particular laser elements with broad gain bandwidth. Typically a collimation lens 106 is used to collimate each beam along the fast diverging dimension. In some cases the collimation optics can be composed of separate fast axis collimation lenses and slow axis collimation lenses. Typically, transform optic 108 is used to combine each beam along the WBC dimension 110 as shown by the input front view 112. Transform optic 108 may be a cylindrical or spherical lens or mirror. The transform optic 108 then overlaps the combined beam onto a dispersive element 114 (here shown as a reflecting diffraction grating). The first-order diffracted beams are incident onto a partially reflecting mirror. The laser resonator is formed between the back facet of the laser elements and the partially reflecting mirror. As such, the combined beam is then transmitted as a single output profile onto an output coupler 116. This output coupler then transmits the combined beams 120, as shown by the output front view 118. It is contemplated creating a system devoid of an output coupler. For instance, a one-dimensional or two-dimensional system with wavelength stabilized laser elements and each having a unique wavelength can be accomplished a few ways. One system or method uses laser elements with feedback from an external wavelength chirped Volume Bragg grating along the beam combining dimension. Another uses internal distributed feedback (DFB) laser elements or internal distributed Bragg reflector (DBR) laser elements. In these systems, the single output profile transmitted from the dispersive element would have the same profile as 118. The output coupler 116 may be a partially reflective mirror or surface or optical coating and act as a common front facet for all the laser elements in diode array 102. A portion of the emitted beams is reflected back into the optical gain and/or lasing portion of diode array 102 in this external cavity system 100a. An external cavity is a lasing system where the secondary mirror is displaced at a distance away from the emission aperture or facet (not labeled) of each laser emitter. Generally, in an external cavity additional optical elements are placed between the emission aperture or facet and the output coupler or partially reflective surface.

Figure 1B:
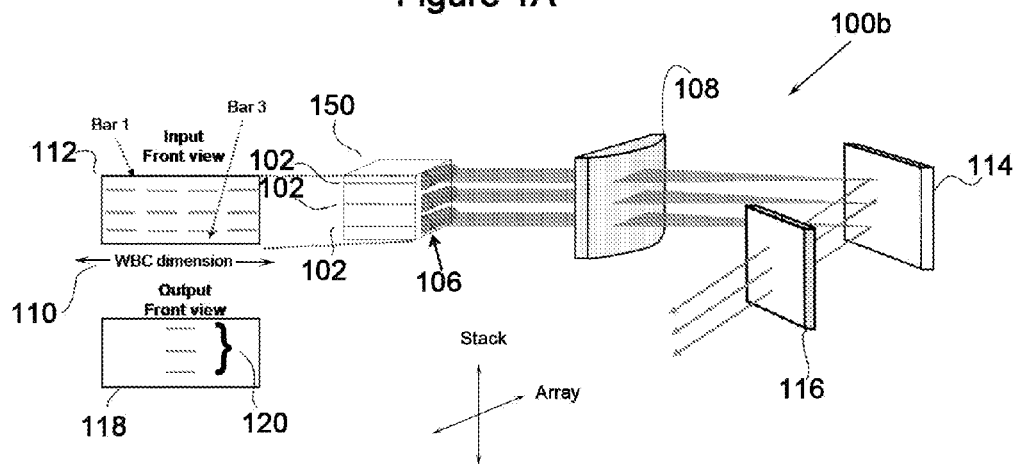
FIG. 1B is a schematic of a WBC method along the array dimension of a two-dimensional array of emitters.

Similarly, FIG. 1B illustrates a stack of laser diode bars each having four emitters where those bars are stacked three high. (See also left side of FIG. 8. Like FIG. 1A, the input front view 112 of FIG. 1B, which in this embodiment is a two-dimensional array of emitters, is combined to produce the output front view 118 or a single column of emitters 120. The emitted beams in external cavity 100b were combined along the array dimension. Here transform optic 108 is a cylindrical lens used to combine the beams along the array. However, a combination of optical elements or optical system can be used as such that the optical elements arrange for all the beams to overlap onto the dispersive element and make sure all the beams along the non-beam-combining dimension are propagating normal to the output coupler. A simple example of such an optical system would be a single cylindrical lens with the appropriate focal length along the beam-combining dimension and two cylindrical lenses that form an afocal telescope along the non beam-combining dimension wherein the optical system projects images onto the partially reflecting mirrors. Many variations of this optical system can be designed to accomplish the same functions.

The array dimension FIG. 1B is also the same axis as the slow dimension of each emitted beam in the case of multi-mode diode laser emitters. Thus, this WBC system may also be called slow axis combining, where the combining dimension is the same dimension of the beams.

Figure 1C:
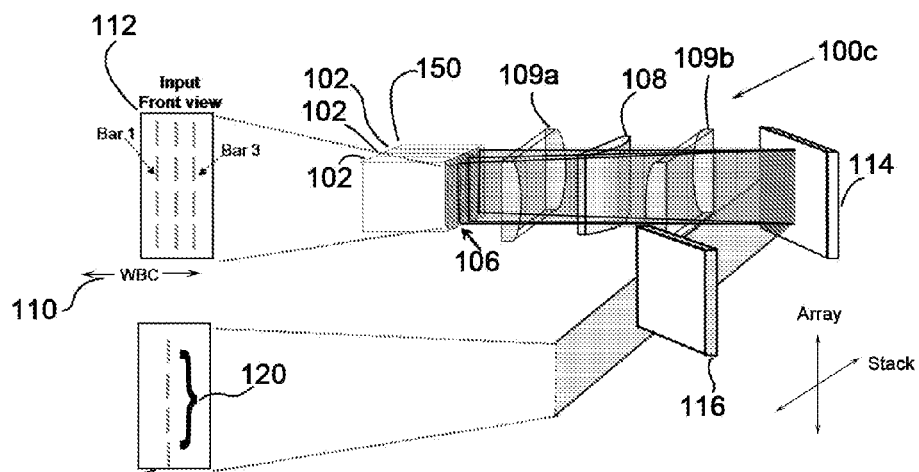
FIG. 1C is a schematic of a WBC method along the stack dimension of a two-dimensional array of emitters.

By contrast, FIG. 1C illustrates a stack 150 of laser diode arrays 102 forming a two-dimensional array of emitters, as shown by 120, where instead of combining along the array dimension as in FIGS. 1A-B, the WBC dimension now follows along the stack dimension of the emitters. Here, the stacking dimension is also aligned with the fast axis dimension of each of the emitted beams. The input front view 112 is now combined to produce the output front view 118 wherein a single column 120 of emitters is shown.

There are various drawbacks to all three configurations. One of the main drawbacks of configuration shown in FIGS. 1A and 1B is that beam combining is performed along the array dimension. As such external-cavity operation is highly dependent on imperfections of the diode array. If broad-area semiconductor laser emitters are used the spectral utilization in the WBC system is not as efficient as if beam combining is performed along the fast axis dimension. One of the main drawbacks of configurations shown in FIG. 1C is that external beam shaping for beam symmetrization is required for efficient coupling into a fiber. The beam symmetrization optics needed for a high power system having a large number of emitters may be complex and non-trivial. Another disadvantage of configuration 1C is that the output beam quality is limited to that of a single laser bar. Typical semiconductor or diode laser bars have 19 to 49 emitters per bar with nearly diffraction-limited beam quality in one dimension and beam quality that is several hundreds of times diffraction-limited along the array dimension. After beam symmetrization the output beam 120 can be coupled into at best a 100 μm/0.22 Numerical Aperture (NA) fiber. To obtain higher beam quality a small number of emitter bars is needed. For example to couple into 50 μm/0.22 NA fiber a five-emitter output beam is needed. In many industrial laser applications a higher brightness laser beam is required. For example, in some applications a two-emitter output beam is needed instead of 19 or 49. The two-emitter output beam can be coupled to a smaller core diameter fiber with much more engineering tolerance and margin. This additional margin in core diameter and NA is critical for reliable operation at high power (kW-class) power levels. While it is possible to procure five-emitter or two-emitter bars the cost and complexity is generally much higher as compare to a standard 19 or 49 emitter bars because of the significantly reduced power per bar. In this disclosure, we disclose methods to remove all of the above short comings. The previous illustrations, FIGS. 1A-C, showed pre-arranged or fixed position arrays and stacks of laser emitters. Generally, arrays or stacks are arranged mechanically or optically to produce a particular one-dimensional or two-dimensional profile. Thus, fixed-position is used to describe a preset condition of laser elements where the laser elements are mechanically fixed with respect to each other as in the case of semiconductor or diode laser bars having multiple emitters or fiber lasers mechanically spaced apart in V-grooves, as well as other laser emitters that come packaged with the emitters in a fixed position. Alternatively, fixed position may refer to the secured placement of a laser emitter in a WBC system where the laser emitter is immobile. Pre-arranged refers to an optical array or profile that is used as the input profile of a WBC system. Often times the pre-arranged position is a result of emitters configured in a mechanically fixed position. Pre-arranged and fixed position may also be used interchangeably. Examples of fixed-position or pre-arranged optical systems are shown in FIGS. 5A-C.

Figure 5A:
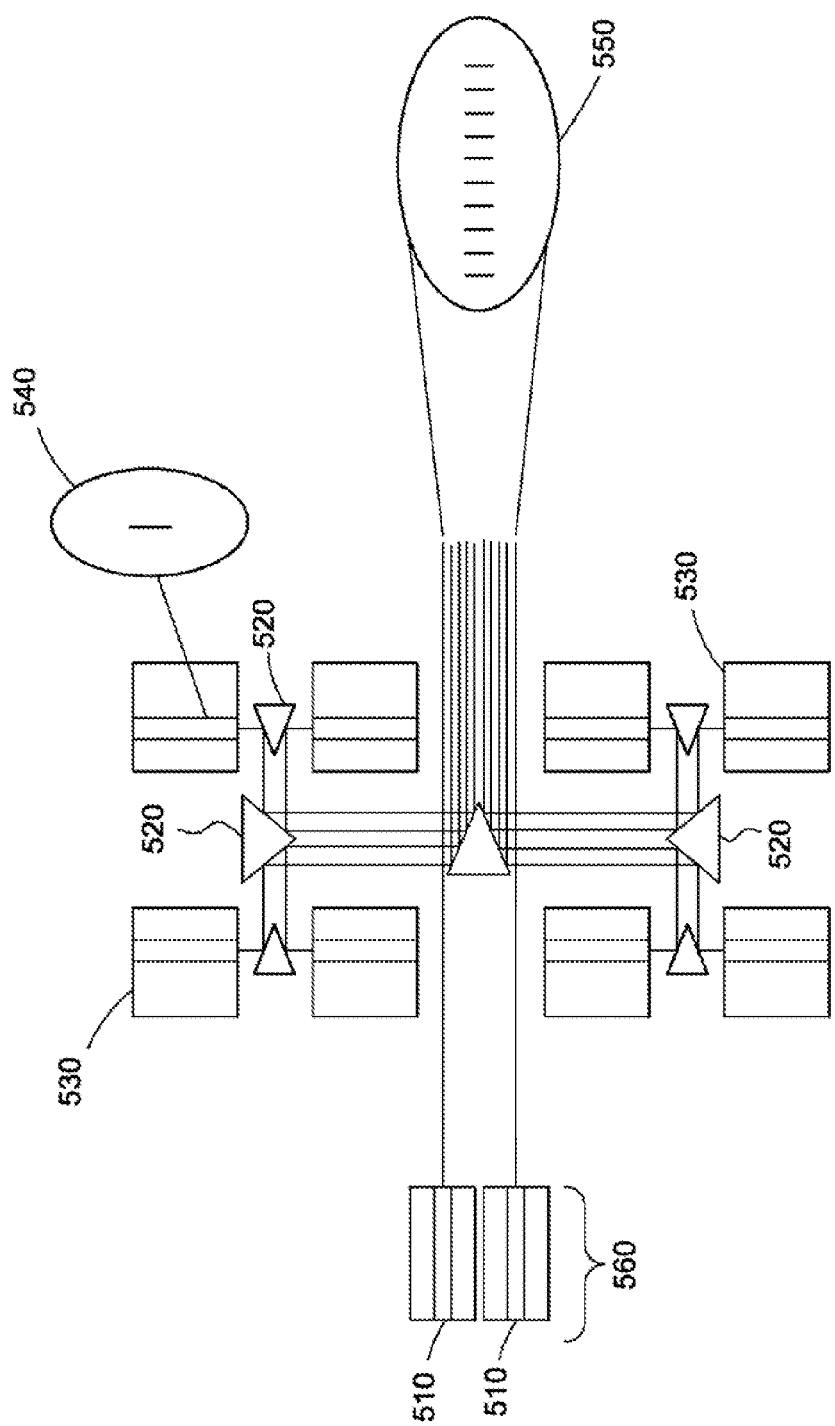
FIGS. 5A-C illustrate related methods for placing combining elements to generate one-dimensional or two-dimensional laser elements
Figure 5B:
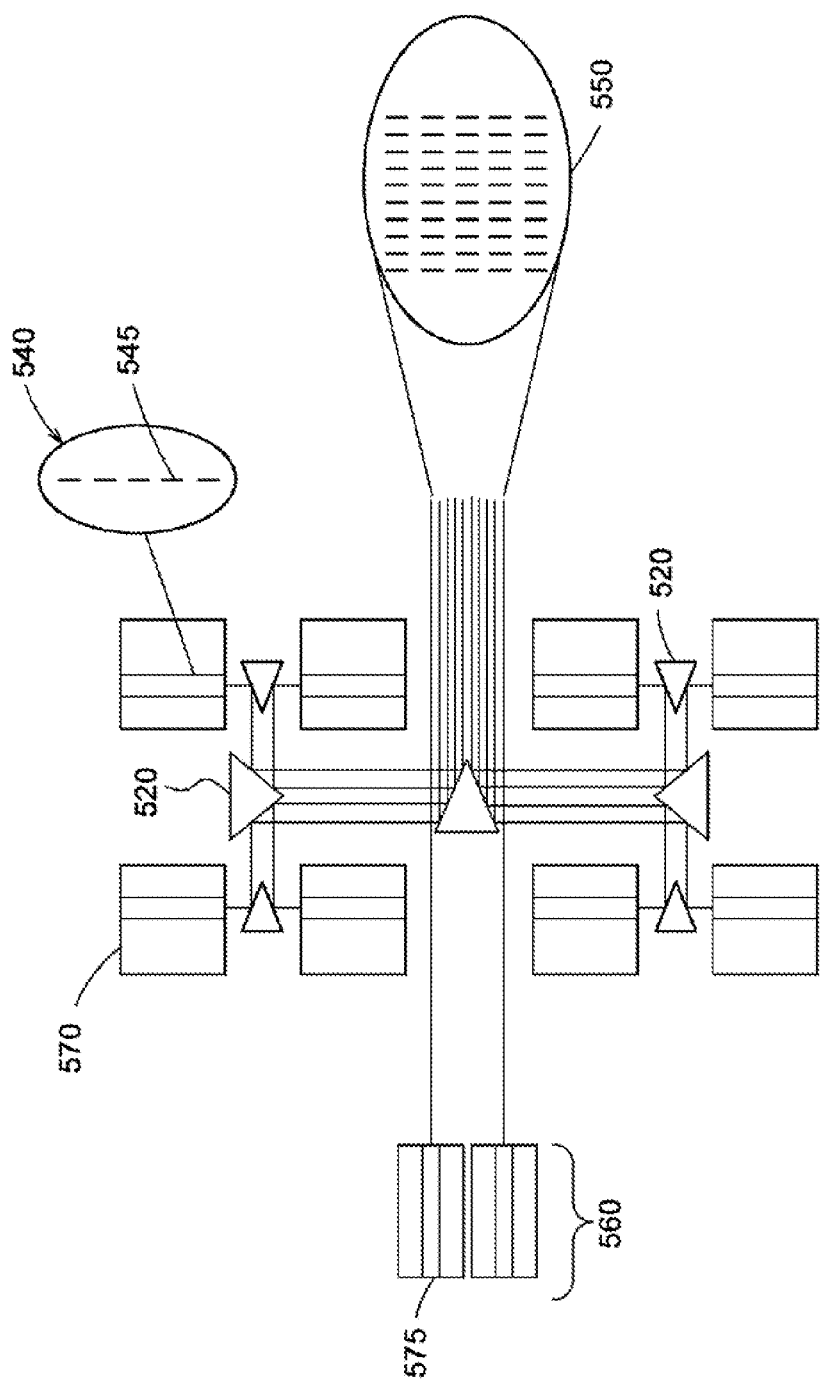
Figure 5C:
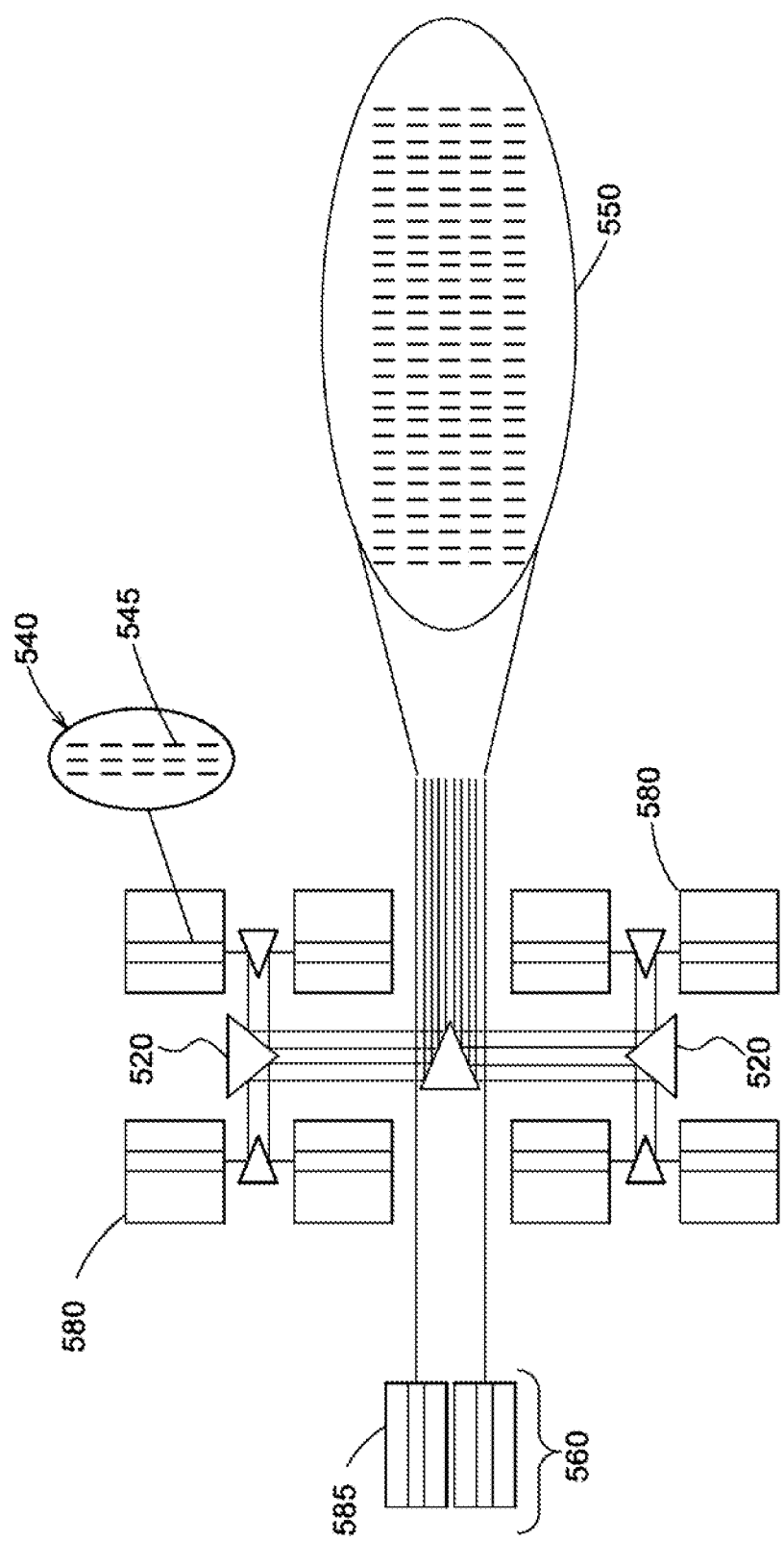

FIGS. 5A-5C refer to prior art illustrated examples of optically arranged one and two-dimensional arrays. FIG. 5A illustrates an optically arranged stack of individual optical elements 510. Mirrors 520 are used to arrange the optical beams from optical elements 530, each optical element 530 having a near field image 540, to produce an image 550 (which includes optical beams from each optical element 530) corresponding to a stack 560 (in the horizontal dimension) of the individual optical elements 510. Although the optical elements 500 may not be arranged in a stack, the mirrors 520 arrange the optical beams such that the image 550 appears to correspond to the stack 560 of optical elements 510. Similarly, in FIG. 5B, the mirrors 520 can be used to arrange optical beams from diode bars or arrays 570 to create an image 550 corresponding to a stack 560 of diode bars or arrays 575. In this example, each diode bar or array 570 has a near field image 540 that includes optical beams 545 from each individual element in the bar or array. Similarly, the minors 520 may also be used to optically arrange laser stacks 580 into an apparent larger overall stack 560 of individual stacks 585 corresponding to image 550, as shown in FIG. 5C.

Nomenclature, used in prior art to define the term "array dimension," referred to one or more laser elements placed side by side where the array dimension is also along the slow axis. One reason for this nomenclature is diode bars with multiple emitters are often arranged in this manner where each emitter is aligned side by side such that each beam's slow dimension is along a row or array. For purposes of this application, an array or row refers to individual emitters or beams arranged across a single dimension. The individual slow or fast dimension of the emitters of the array may also be aligned along the array dimension, but this alignment is not to be assumed. This is important because some embodiments described herein individually rotate the slow dimension of each beam aligned along an array or row. Additionally, the slow axis of a beam refers to the wider dimension of the beam and is typically also the slowest diverging dimension, while the fast axis refers to the narrower dimension of the beam and is typically the fastest diverging dimension. The slow axis may also refer to single mode beams Additionally, some prior art defines the term "stack or stacking dimension" referred to as two or more arrays stacked together, where the beams' fast dimension is the same as the stacking dimension. These stacks were pre-arranged mechanically or optically. However, for purposes of this application a stack refers to a column of beams or laser elements and may or may not be along the fast dimension. Particularly, as discussed above, individual beams or elements may be rotated within a stack or column.

In some embodiments it is useful to note that the array dimension and the slow dimension of each emitted beam are initially oriented across the same axis; however, those dimensions, as described in this application, may become oriented at an offset angle with respect to each other. In other embodiments, the array dimension and only a portion of the emitters arranged along the array or perfectly aligned the same axis at a certain position in a WBC system. For example, the array dimension of a diode bar may have emitters arranged along the array dimension, but because of smile (often a deformation or bowing of the bar) individual emitters' slow emitting dimension is slightly skewed or offset from the array dimension.

Laser sources based on common "commercial, off-the-shelf" or COTS high power laser diode arrays and stacks are based on broad-area semiconductor or diode laser elements. Typically, the beam quality of these elements is diffraction-limited along the fast axis and many times diffraction-limited along the slow axis of the laser elements. It is to be appreciated that although the following discussion may refer primarily to single emitter laser diodes, diode laser bars and diode laser stacks, embodiments of the invention are not limited to semiconductor or laser diodes and may be used with many different types of laser and amplifier emitters, including fiber lasers and amplifiers, individually packaged diode lasers, other types of semiconductor lasers including quantum cascade lasers (QCLs), tapered lasers, ridge waveguide (RWG) lasers, distributed feedback (DFB) lasers, distributed Bragg reflector (DBR) lasers, grating coupled surface emitting laser, vertical cavity surface emitting laser (VCSEL), and other types of lasers and amplifiers.

All of the embodiments described herein can be applied to WBC of diode laser single emitters, bars, and stacks, and arrays of such emitters. In those embodiments employing stacking of diode laser elements, mechanical stacking or optical stacking approaches can be employed. In addition, where an HR coating is indicated at the facet of a diode laser element, the HR coating can be replaced by an AR coating, provided that external cavity optical components, including but not limited to a collimating optic and bulk HR mirror are used in combination with the AR coating. This approach is used, for example, with WBC of diode amplifier elements. Slow axis is also defined as the worse beam quality direction of the laser emission. The slow axis typically corresponds to the direction parallel to the semiconductor chip at the plane of the emission aperture of the diode laser element. Fast axis is defined as the better beam quality direction of the laser emission. Fast axis typically corresponds to the direction perpendicular to the semiconductor chip at the plane of the emission aperture of the diode laser element.

Figure 10:
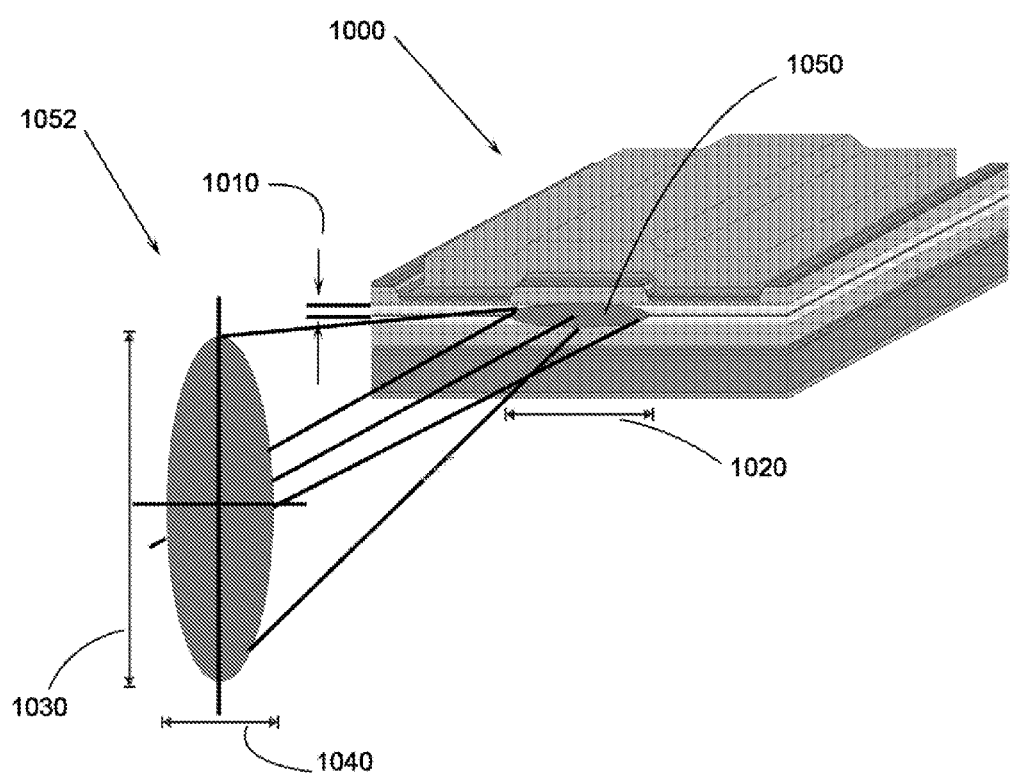
FIG. 10 is illustrative of a single semiconductor chip emitter.

An example of a single semiconductor chip emitter 1000 is shown in FIG. 10. The aperture 1050 is also indicative of the initial beam profile. Here, the height 1010 at 1050 is measured along the stack dimension. Width 1020 at 1050 is measured along the array dimension. Height 1010 is the shorter dimension at 1050 than width 1020. However, height 1010 expands faster or diverges to beam profile 1052, which is placed at a distance away from the initial aperture 1050. Thus, the fast axis is along the stack dimension. Width 1020 which expands or diverges at a slower rate as indicated by width 1040 being a smaller dimension than height 1030. Thus, the slow axis of the beam profile is along the array dimension. Though not shown, multiple single emitters such as 1000 may be arranged in a bar side by side along the array dimension.

Figure 2:
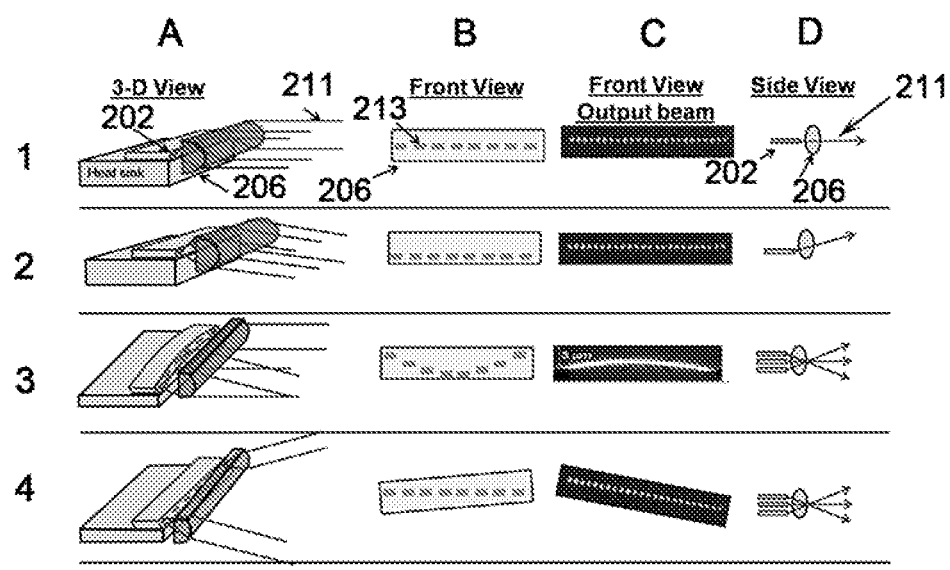
FIG. 2 is a schematic showing the effects of smile in a WBC method along the stack dimension of a two-dimensional array of diode laser emitters.

Drawbacks for combining beams primarily along their slow axis dimension may include: reduced power and brightness due to lasing inefficiencies caused by pointing errors, smile and other misalignments. As illustrated in FIG. 2, a laser diode array with smile, one often caused by the diode array being bowed in the middle sometimes caused by the diode laser bar mounting process, is one where the individual emitters along the array form a typical curvature representative of that of a smile. Pointing errors are individual emitters along the diode bar emitting beams at an angle other than normal from the emission point. Pointing error may be related to smile, for example, the effect of variable pointing along the bar direction of a diode laser bar with smile when the bar is lensed by a horizontal fast axis collimating lens. These errors cause feedback from the external cavity, which consists of the transform lens, grating, and output coupler, not to couple back to the diode laser elements. Some negative effects of this mis-coupling are that the WBC laser breaks wavelength lock and the diode laser or related packaging may be damaged from mis-coupled or misaligned feedback not re-entering the optical gain medium. For instance the feedback may hit some epoxy or solder in contact or in close proximity to a diode bar and cause the diode bar to fail catastrophically.

Row 1 of FIG. 2 shows a single laser diode bar 202 without any errors. The embodiments illustrated are exemplary of a diode bar mounted on a heat sink and collimated by a fast-axis collimation optic 206. Column A shows a perspective or 3-D view of the trajectory of the output beams 211 going through the collimation optic 206. Column D shows a side view of the trajectory of the emitted beams 211 passing through the collimation optic 206. Column B shows the front view of the laser facet with each individual laser element 213 with respect to the collimation optic 206. As illustrated in row 1, the laser elements 213 are perfectly straight. Additionally, the collimation optic 206 is centered with respect to all the laser elements 213. Column C shows the expected output beam from a system with this kind of input. Row 2 illustrates a diode laser array with pointing error. Shown by column B of row 2 the laser elements and collimation optic are slightly offset from each other. The result, as illustrated, is the emitted beams having an undesired trajectory that may result in reduced lasing efficiency for an external cavity. Additionally, the output profile may be offset to render the system ineffective or cause additional modifications. Row 3 shows an array with packaging error. The laser elements no longer sit on a straight line, and there is curvature of the bar. This is sometimes referred to as 'smile.' As shown on row 3, smile can introduce even more trajectory problems as there is no uniform path or direction common to the system. Column D of row 3 further illustrates beams 211 exiting at various angles. Row 4 illustrates a collimation lens unaligned with the laser elements in a twisted or angled manner. The result is probably the worst of all as the output beams generally have the most collimation or twisting errors. In most systems, the actual error in diode arrays and stacks is a combination of the errors in rows 2, 3, and 4. In both methods 2 and 3, using VBG's and diffraction gratings, laser elements with imperfections result in output beams no longer pointing parallel to the optical axis. These off optical axis beams result in each of the laser elements lasing at different wavelengths. The plurality of different wavelengths increases the output spectrum of the system to become broad as mentioned above.

One of the advantages of performing WBC along the stacking dimension (here also primarily the fast dimension) of a stack of diode laser bars is that it compensates for smile as shown in FIG. 2. Pointing and other alignment errors are not compensated by performing WBC along the array dimension (also primarily slow dimension). A diode bar array may have a range of emitters typically from 19 to 49 or more. As noted, diode bar arrays are typically formed such that the array dimension is where each emitter's slow dimension is aligned side by side with the other emitters. As a result, when using WBC along the array dimension, whether a diode bar array has 19 or 49 emitters (or any other number of emitters), the result is that of a single emitter. By contrast, when performing WBC along the orthogonal or fast dimension of the same single diode bar array, the result is each emitted beam increases in spectral brightness, or narrowed spectral bandwidth, but there is not a reduction in the number of beams (equivalently, there is not an increase in spatial brightness).

Figure 8:
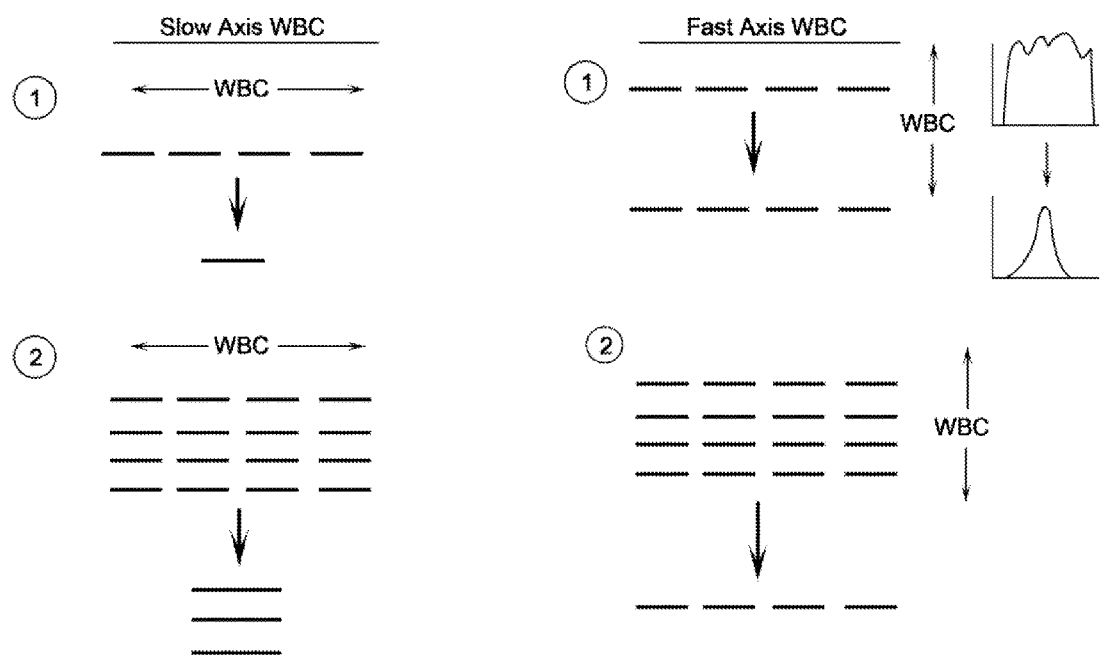
FIG. 8 illustrates the difference between slow and fast WBC.

This point is illustrated in FIG. 8. On the left of FIG. 8 is shown a front view of an array of emitters 1 and 2 where WBC along the slow dimension is being performed. Along the right side using the same arrays 1 and 2, WBC along the fast dimension is being performed. When comparing array 1, WBC along the slow dimension reduces the output profile to that of a single beam, while WBC along the fast dimension narrows the spectral bandwidth, as shown along the right side array 1, but does not reduce the output profile size to that of a single beam.

Using COTS diode bars and stacks the output beam from beam combining along the stack dimension is usually highly asymmetric. Symmetrization, or reducing the beam profile ratio closer to equaling one, of the beam profile is important when trying to couple the resultant output beam profile into an optical fiber. Many of the applications of combining a plurality of laser emitters require fiber coupling at some point in an expanded system. Thus, having greater control over the output profile is another advantage of the application.

Further analyzing array 2 in FIG. 8 shows the limitation of the number of emitters per laser diode array that is practical for performing WBC along the fast dimension if very high brightness symmetrization of the output profile is desired. As discussed above, typically the emitters in a laser diode bar are aligned side by side along their slow dimension. Each additional laser element in a diode bar is going to increase the asymmetry in the output beam profile. When performing WBC along the fast dimension, even if a number of laser diode bars are stacked on each other, the resultant output profile will still be that of a single laser diode bar. For example if one uses a COTS 19-emitter diode laser bar, the best that one can expect is to couple the output into a 100 µm/0.22 NA fiber. Thus, to couple into a smaller core fiber lower number of emitters per bar is required. One could simply fix the number of emitters in the laser diode array to 5 emitters in order to help with the symmetrization ratio; however, fewer emitters per laser diode bar array generally results in an increase of cost of per bar or cost per Watt of output power. For instance, the cost of diode bar having 5 emitters may be around $2,000 whereas the cost of diode bar having 49 emitters may be around roughly the same price. However, the 49 emitter bar may have a total power output of up to an order-of-magnitude greater than that of the 5 emitter bar. Thus, it would be advantageous for a WBC system to be able to achieve a very high brightness output beams using COTS diode bars and stacks with larger number of emitters. An additional advantage of bars with larger number of emitters is the ability to de-rate the power per emitter to achieve a certain power level per bar for a given fiber-coupled power level, thereby increasing the diode laser bar lifetime or bar reliability.

Figure 3A:
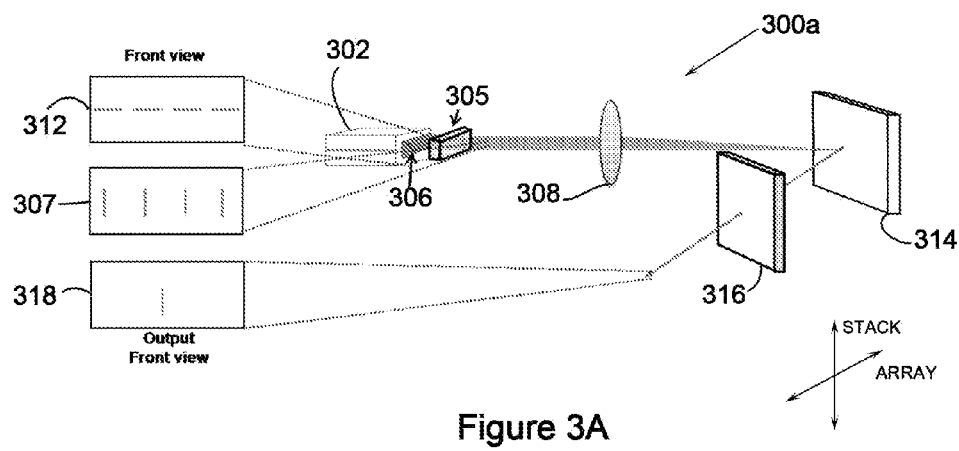
FIG. 3A is a schematic of a WBC system including an optical rotator selectively rotating a one-dimensional array of beams.
Figure 3B:
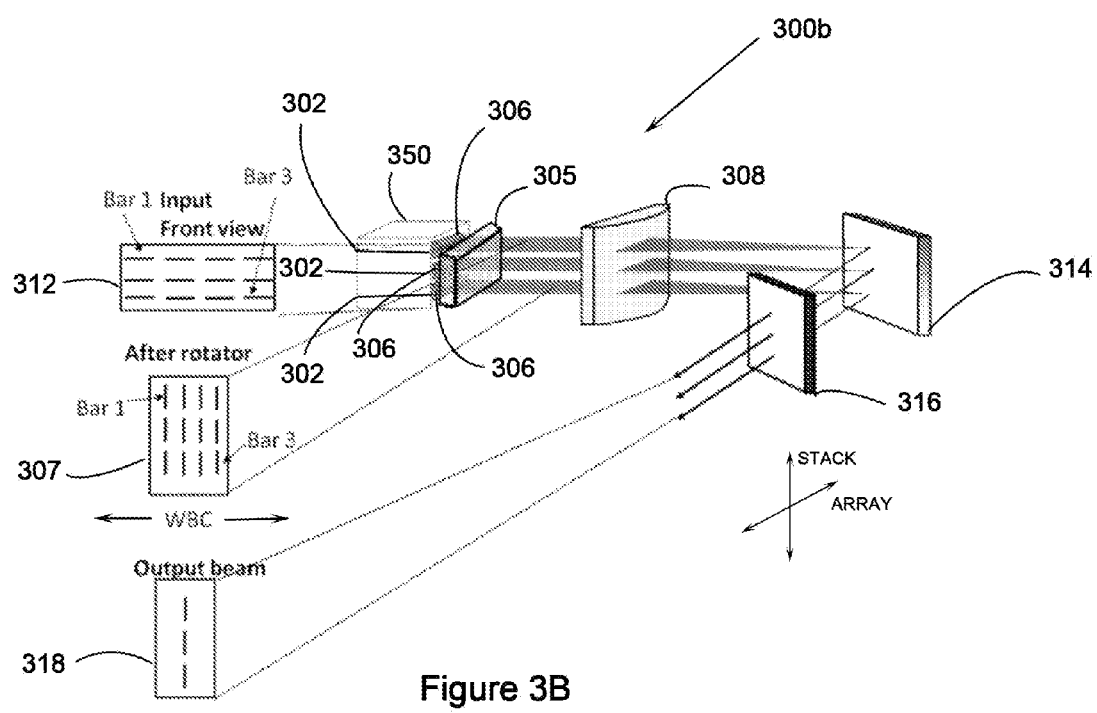
FIG. 3B is a schematic of a WBC system including an optical rotator selectively rotating a two-dimensional array of beams.

One embodiment that addresses this issue is illustrated in FIG. 3A, which shows a schematic of WBC system 300a with an optical rotator 305 placed after collimation lenses 306 and before the transform optic 308. It should be noted the transform optic 308 may be comprised of a number of lenses or mirrors or other optical components. The optical rotator 305 individually rotates the fast and slow dimension of each emitted beam shown in the input front view 312 to produce the re-oriented front view 307. It should be noted that the optical rotators can selectively rotate each beam individually irrespective of the other beams or can rotate all the beams through the same angle simultaneously. It should also be noted that a cluster of two or more beams can be rotated simultaneously. The resulting output after WBC is performed along the array dimension is shown in output front view 318 as a single emitter. Dispersive element 314 is shown as a reflection diffraction grating, but may also be a dispersive prism, a grism (prism+grating), transmission grating, and Echelle grating. This particular embodiment illustrated shows only four laser emitters; however, as discussed above this system could take advantage of a laser diode array that included many more elements, e.g., 49. This particular embodiment illustrated shows a single bar at a particular wavelength band (example at 976 nm) but in actual practice it can be composed of multiple bars, all at the same particular wavelength band, arranged side-by-side. Furthermore, multiple wavelength bands (example 976 nm, 915 nm, and 808 nm), with each band composing of multiple bars, can we combined in a single cavity. Because WBC was performed across the fast dimension of each beam it easier to design a system with a higher brightness (higher efficiency due to insensitivity due to bar imperfections); additionally, narrower bandwidth and higher power output are all achieved. As previously discussed it should noted some embodiments WBC system 300a may not include output coupler 316 and/or collimation lens(es) 306. Furthermore, pointing errors and smile errors are compensated for by combining along the stack dimension (In this embodiment this is also the fast dimension). FIG. 3B, shows an implementation similar to 3A except that a stack 350 of laser arrays 302 forms a 2-D input profile 312. Cavity 300b similarly consists of collimation lens(es) 306, optical rotator 305, transform optic 308, dispersive element 308 (here a diffraction grating), and an output coupler 316 with a partially reflecting surface. Each of the beams is individually rotated by optical rotator 305 to form an after rotator profile 307. The WBC dimension is along the array dimension, but with the rotation each of the beams will be combined across their fast axis. Fast axis WBC produces outputs with very narrow line widths and high spectral brightness. These are usually ideal for industrial applications such as welding. After transform optic 308 overlaps the rotated beams onto dispersive element 314 an single output profile is produced and partially reflected back through the cavity into the laser elements. The output profile 318 is now comprised of a line of three (3) beams that is quite asymmetric.

Figure 3C:
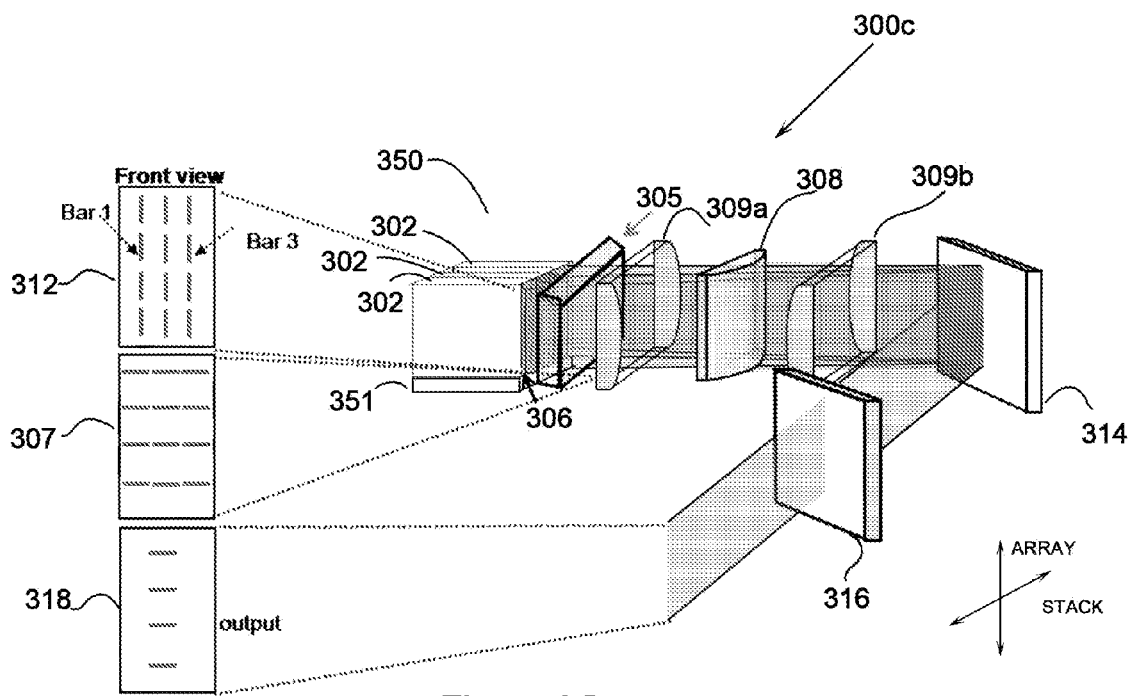
FIG. 3C is a schematic of a WBC system including an optical rotator selectively reorienting a two-dimensional array of beams.

FIG. 3C shows the same implementation when applied to 2-D laser elements. The system consists of 2-D laser elements 302, optical rotator 305, transform optical system (308 and 309a-b) a dispersive element 314, and a partially reflecting mirror 316. FIG. 3C illustrates a stack 350 of laser diode bars 302 with each bar having an optical rotator 305. Each of the diode bars 302 (three total) as shown in external cavity 300c includes four emitters. After input front view 312 is reoriented by optical rotator 305, reoriented front view 307 now the slow dimension of each beam aligned along the stack dimension. WBC is performed along the dimension, which is now the slow axis of each beam and the output front view 318 now comprises single column of beams with each beam's slow dimension oriented along the stack dimension. Optic 309a and 309b provide a cylindrical telescope to image along the array dimension. The function of the three cylindrical lenses are to provide two main functions. The middle cylindrical lens is the transform lens and its main function is to overlap all the beams onto the dispersive element. The two other cylindrical lenses 309a and 309b form an afocal cylindrical telescope along the non-beam combining dimension. Its main function is to make sure all laser elements along the non-beam combining are propagation normal to the partially reflecting mirror. As such the implementation as shown in FIG. 3C has the same advantages as the one shown in FIG. 1C. However, unlike the implementation as shown in FIG. 1C the output beam is not the same as the input beam. The number of emitters in the output beam 318 in FIG. 3C is the same as the number of bars in the stack. For example, if the 2-D laser source consists of a 3-bar stack with each bar composed of 49 emitters, then the output beam in FIG. 1C is a single bar with 49 emitters. However, in FIG. 3C the output beam is a single bar with only 3 emitters. Thus, the output beam quality or brightness is more than one order of magnitude higher. This brightness improvement is very significant for fiber-coupling. For higher power and brightness scaling multiple stacks can be arranged side-by-side.

To illustrate this configuration further, for example, assume WBC is to be performed of a 3-bar stack, with each bar comprising of 19 emitters. So far, there are three options. First, wavelength beam combining can be performed along the array dimension to generate 3 beams as shown in FIG. 1B. Second, wavelength beam combining can be performed along the stack dimension to generate 19 beams a shown FIG. 1C. Third, wavelength beam combining can be performed along the array dimension using beam rotator to generate 19 beams as shown FIG. 3C. There are various trade-offs for all three configuration. The first case gives the highest spatial brightness but the lowest spectral brightness. The second case gives the lowest spatial brightness with moderate spectral brightness and beam symmetrization is not required to couple into a fiber. The third case gives the lowest spatial brightness but the highest spectral brightness and beam symmetrization is required to couple into an optical fiber. In some applications this more desirable.

Figure 3D:
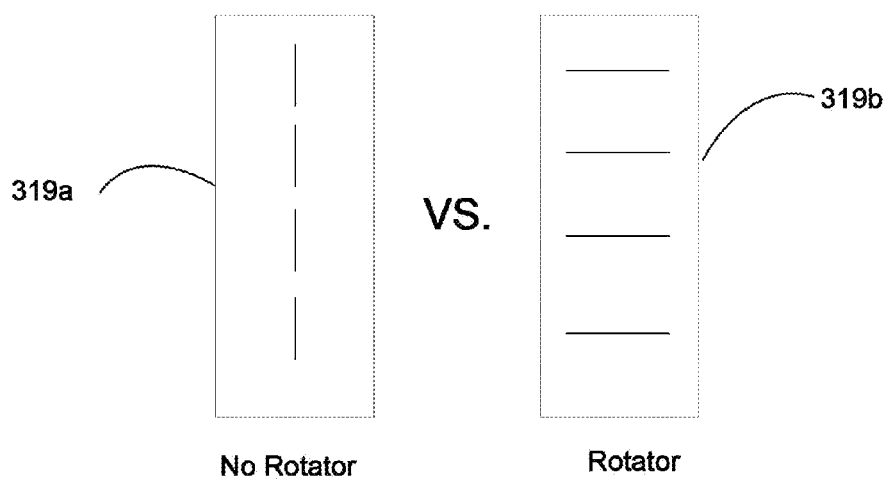
FIG. 3D illustrates output profile views of the system of FIG. 3c with and without an optical rotator.

To illustrated the reduction in asymmetry FIG. 3D has been drawn showing the final output profile 319a where the system of 300b did not have an optical rotator and output profile 319b where the system includes an optical rotator. Though these figures are not drawn to scale, they illustrate an advantage achieved by utilizing an optical rotator, in a system with this configuration where WBC is performed across the slow dimension of each beam. The shorter and wider 319b is more suitable for fiber coupling than the taller and slimmer 319a.

Figure 4A:
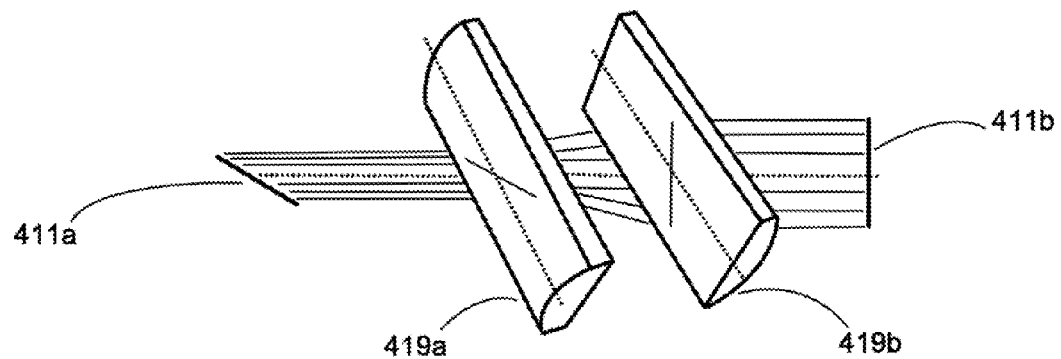
FIGS. 4A-C illustrate examples of optical rotators.
Figure 4B:
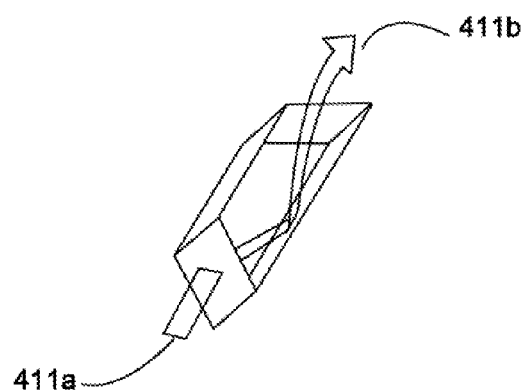
Figure 4C:
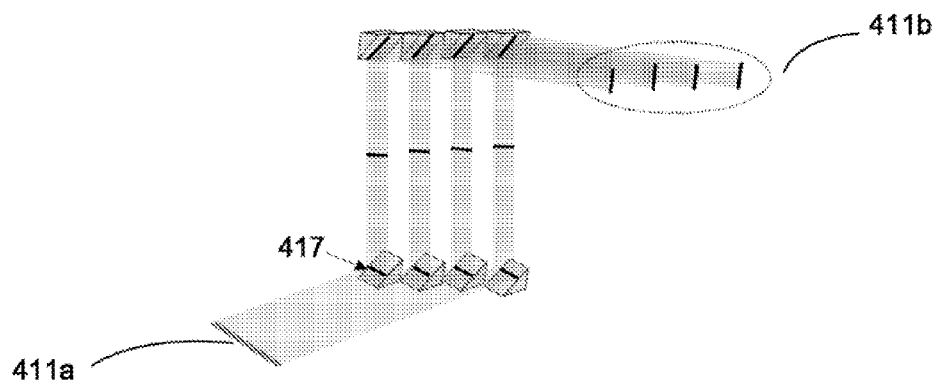

An example of various optical rotators are shown in FIG. 4A-C. FIG. 4A illustrates an array of cylindrical lenses (419a and 419b) that cause input beam 411a to be rotated to a new orientation at 411b. FIG. 4B similarly shows input 411a coming into the prism at an angle, which results in a new orientation or rotation beam 411b. FIG. 4C illustrates an embodiment using a set of step mirrors 417 to cause input 411a to rotate at an 80-90 degree angle with the other input beams resulting in a new alignment of the beams 411b where they are side by side along their respective fast axis. These devices and others may cause rotation through both non-polarization sensitive as well as polarization sensitive means. Many of these devices become more effective if the incoming beams are collimated in at least the fast dimension. It is also understand that the optical rotators can selectively rotate the beams at various including less than 90 degrees, 90 degrees and greater than 90 degrees.

The optical rotators in the previous embodiments may selectively rotate individual, rows or columns, and groups of beams. In some embodiments a set angle of rotation, such as a range of 80-90 degrees is applied to the entire profile or subset of the profile. In other instances, varying angles of rotation are applied uniquely to each beam, row, column or subset of the profile. (see FIGS. 9A-B) For instance, one beam may be rotated by 45 degrees in a clockwise direction while an adjacent beam is rotated 45 degrees in a counter-clockwise direction. It is also contemplated one beam is rotated 10 degrees and another is rotated 70 degrees. The flexibility the system provides can be applied to a variety of input profiles, which in turn helps determine how the output profile is to be formed.

Figure 9A:
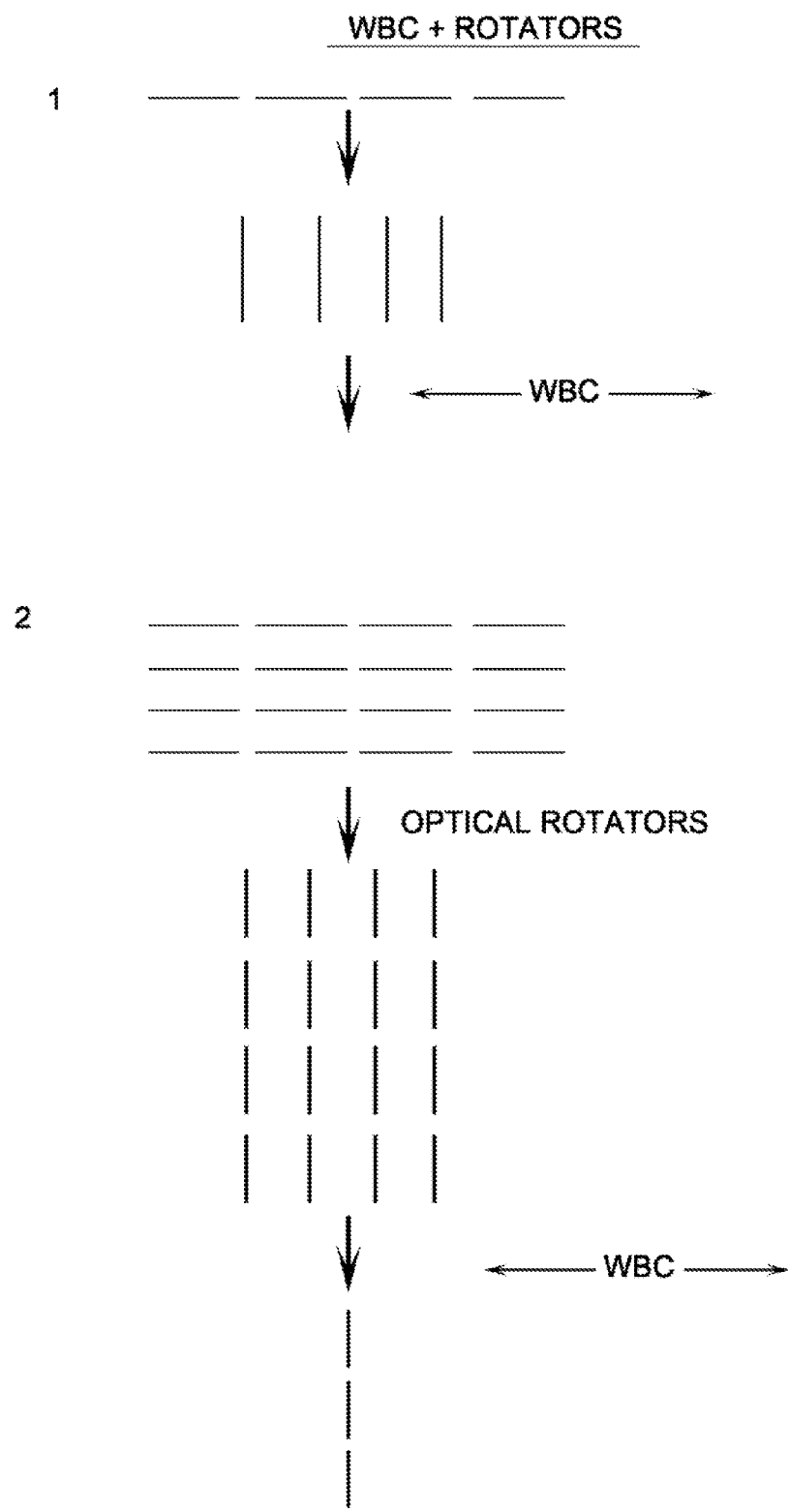
FIG. 9A illustrates embodiments using an optical rotator before WBC in both a single and stacked array configurations.
Figure 9B:
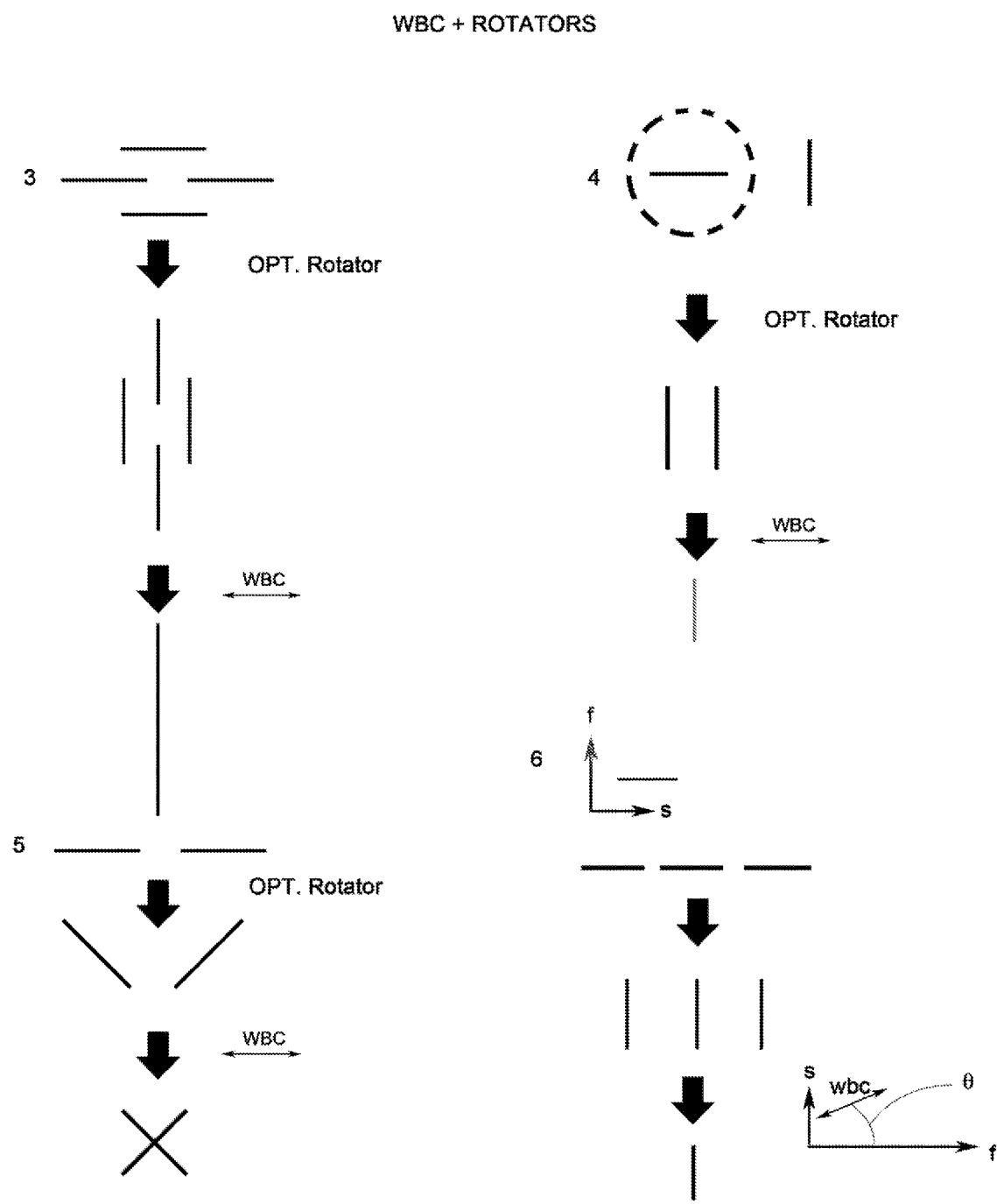
FIG. 9B illustrates additional embodiments using an optical rotator before WBC.

Performing WBC along an intermediate angle between the slow and fast dimension of the emitted beams is also well within the scope of the invention (See for example 6 on FIG. 9B). Some Laser elements as described herein, produce electromagnetic radiation and include an optical gain medium. When the radiation or beams exit the optical gain portion they generally are collimated along the slow and/or fast dimension through a series of micro lenses. From this point, the embodiments already described in this section included an optical rotator that selectively and rotated each beam prior to the beams being overlapped by a transform lens along either the slow or the fast dimension of each beam onto a dispersive element. The output coupler may or may not be coated to partially reflect the beams back into the system to the laser element where the returned beams assist in generating more external cavity feedback in the optical gain element portion until they are reflected off a fully reflective mirror in the back portion of the laser element. The location of the optical elements listed above and others not listed are with respect to the second partially reflective surface helps decide whether the optical elements are within an external cavity system or outside of the lasing cavity. In some embodiments, not shown, the second partially reflective mirror resides at the end of the optical gain elements and prior to the collimating or rotating optics.

Figure 6:
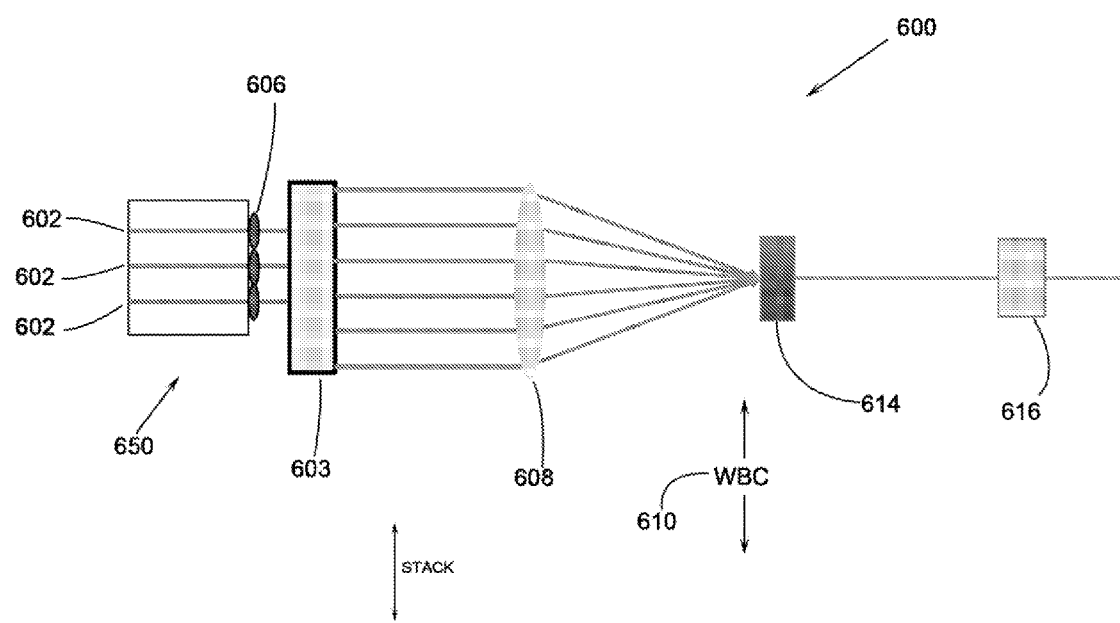
FIG. 6 illustrates a WBC embodiment having a spatial repositioning element.

Another method for manipulating beams and configurations to take advantage of the various WBC methods includes using a spatial repositioning element. This spatial repositioning element may be placed in an external cavity at a similar location as to that of an optical rotator. For example, FIG. 6 shows a spatial repositioning element 603 placed in the external cavity WBC system 600 after the collimating lenses 606 and before the transform optic(s) 608. The purpose of a spatial repositioning element is to reconfigure an array of elements into a new configuration. FIG. 6 shows a three-bar stack with N elements reconfigured to a six-bar stack with N/2 elements. Spatial repositioning is particularly useful in embodiments such as 600, where stack 650 is a mechanical stack or one where diode bar arrays 602 and their output beams were placed on top of each other either mechanically or optically. With this kind of configuration the laser elements have a fixed-position to one another. Using a spatial repositioning element can form a new configuration that is more ideal for WBC along the fast dimension. The new configuration makes the output profile more suitable for fiber coupling.

Figure 7:
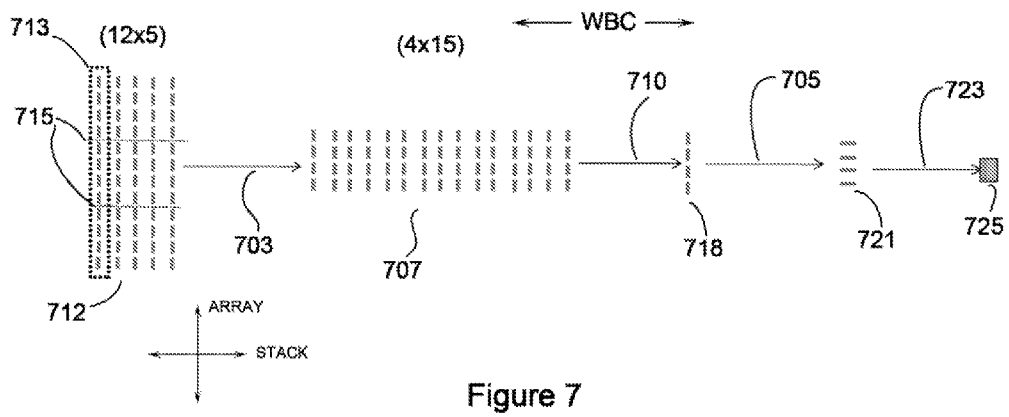
FIG. 7 illustrates an embodiment of a two-dimensional array of emitters being reconfigured before a WBC step and individual beam rotation after the WBC step.

For example, FIG. 7 illustrates an embodiment wherein a two-dimensional array of emitters 712 is reconfigured during a spatial repositioning step 703 by a spatial repositioning optical element such as an array of periscope mirrors. The reconfigured array shown by reconfigured front view 707 is now ready for a WBC step 710 to be performed across the WBC dimension, which here is the fast dimension of each element. The original two-dimensional profile in this example embodiment 700 is an array of 12 emitters tall and 5 emitters wide. After the array is transmitted or reflected by the spatial repositioning element a new array of 4 elements tall and 15 elements wide is produced. In both arrays the emitters are arranged such that the slow dimension of each is vertical while the fast dimension is horizontal. WBC is performed along the fast dimension which collapses the 15 columns of emitters in the second array into 1 column that is 4 emitters tall. This output is already more symmetrical than if WBC had been performed on the original array, which would have resulted in a single column 15 emitters tall. As shown, this new output may be further symmetrized by an individually rotating step 705 rotating each emitter by 90 degrees. In turn, a post WBC front view 721 is produced being the width of a single beam along the slow dimension and stacked 4 elements high, which is a more suitable for coupling into a fiber.

One way of reconfiguring the elements in a one-dimensional or two-dimensional profile is to make 'cuts' or break the profile into sections and realign each section accordingly. For example, in FIG. 7 two cuts 715 were made in 713. Each section was placed side by side to form 707. These optical cuts can be appreciated if we note the elements of 713 had a pre-arranged or fixed-position relationship. It is also well within the scope to imagine any number of cuts being made to reposition the initial input beam profile. Each of these sections may in addition to being placed side by side, but on top and even randomized if so desired.

Spatial repositioning elements may be comprised of a variety of optical elements including periscope optics that are both polarized and non-polarized as well as other repositioning optics. Step mirrors as shown in FIG. 4a may also be reconfigured to become a spatial repositioning element.

It is contemplated spatial repositioning elements and optical rotators may be used in the same external-cavity system or a combination of inside and outside of the cavity system. The order of which element appears first is not as important and is generally determined by the desired output profile.

Additional embodiments encompassing, but not limiting the scope of the invention, are illustrated in FIGS. 9A-B. The system shown in 1 of FIG. 9A shows a single array of 4 beams aligned side to side along the slow dimension. An optical rotator individually rotates each beam. The beams are then combined along the fast dimension and are reduced to a single beam by WBC. In this arrangement it is important to note that the 4 beams could easily be 49 or more beams. It may also be noted that if some of the emitters are physically detached from the other emitters, the individual emitter may be mechanically rotated to be configured in an ideal profile. A mechanical rotator may be comprised of a variety of elements including friction sliders, locking bearings, tubes, and other mechanisms configured to rotate the laser element. Once a desired position is achieved the laser elements may then be fixed into place. It is also conceived that an automated rotating system that can adjust the beam profile depending on the desired profile may be implemented. This automated system may either mechanically reposition a laser or optical element or a new optical element may be inserted in and out of the system to change the output profile as desired.

System 2 shown in FIG. 9A, shows a two-dimensional array having 3 stacked arrays with 4 beams each aligned along the slow dimension. (Similar to FIG. 3C) As this stacked array passes through an optical rotator and WBC along the fast dimension a single column of 3 beams tall aligned top to bottom along the slow dimension is created. Again it is appreciated that if the three stacked arrays shown in this system had 50 elements, the same output profile would be created, albeit one that is brighter and has a higher output power.

System 3 in FIG. 9B, shows a diamond pattern of 4 beams wherein the beams are all substantially parallel to one another. This pattern may also be indicative of a random pattern. The beams are rotated and combined along the fast dimension, which results in a column of three beams aligned along the slow dimension from top to bottom. Missing elements of diode laser bars and stacks due to emitter failure or other reasons, is an example of System 3. System 4, illustrates a system where the beams are not aligned, but that one beam is rotated to be aligned with a second beam such that both beams are combined along the fast dimension forming a single beam. System 4, demonstrates a number of possibilities that expands WBC methods beyond using laser diode arrays. For instance, the input beams in System 4 could be from carbon dioxide ($CO_2$) lasers, semiconductor or diode lasers, diode pumped fiber lasers, lamp-pumped or diode-pumped Nd:YAG lasers, Disk Lasers, and so forth. The ability to mix and match the type of lasers and wavelengths of lasers to be combined is another advantage encompassed within the scope of this invention.

System 5, illustrates a system where the beams are not rotated to be fully aligned with WBC dimension. The result is a hybrid output that maintains many of the advantages of WBC along the fast dimension. In several embodiments the beams are rotated a full 90 degrees to become aligned with WBC dimension, which has often been the same direction or dimension as the fast dimension. However, System 5 and again System 6 show that optical rotation of the beams as a whole (System 6) or individually (System 5) may be such that the fast dimension of one or more beams is at an angle theta or offset by a number of degrees with respect to the WBC dimension. A full 90 degree offset would align the WBC dimension with the slow dimension while a 45 degree offset would orient the WBC dimension at an angle halfway between the slow and fast dimension of a beam as these dimension are orthogonal to each other. In one embodiment, the WBC dimension has an angle theta at approximately 3 degrees off the fast dimension of a beam.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A wavelength beam combiner comprising:
    an optical rotator configured to selectively rotate beams emitted by a plurality of beam emitters;
    a transform optic configured to receive and combine the selectively rotated beams along a beam combining dimension;
    a dispersive element positioned to receive and transmit the combined beams; and
    a partially-reflecting output coupler arranged to receive the combined beams from the dispersive element, to reflect a portion of the combined beams toward the dispersive element, and to transmit the combined beams as a multi-wavelength beam comprising optical radiation having a plurality of wavelengths.

2. The wavelength beam combiner of claim 1, wherein at least two of the beam emitters have a fixed-position relationship.

3. The wavelength beam combiner of claim 1, wherein the beam emitters include a first reflective surface and an optical gain medium.

4. The wavelength beam combiner of claim 1, further including a collimation optic configured to receive beams from the beam emitters and collimate one or more beams along a dimension of the beam.

5. The wavelength beam combiner of claim 1, further including a spatial repositioning element configured to spatially-reposition one or more beams prior to being received by the transform lens.

6. The wavelength beam combiner of claim 1, wherein the emitted beams have an asymmetrical profile.

7. A wavelength beam combiner comprising:
    a spatial repositioning element configured to spatially-reposition beams emitted by a plurality of beam emitters;
    a transform optic arranged to receive the spatially-repositioned beams and combine the beams along a beam combining dimension;
    a dispersive element positioned at a region of overlap of the combined beams to receive and transmit the combined beams; and
    an optical coupler configured to reflect a portion of the beams back into each of the beam emitters.

8. The wavelength beam combiner of claim 7, wherein the plurality of beam emitters produces a two-dimensional profile and the spatial-repositioning element reduces the number of beams emitted along a first dimension while increasing the number of beams emitted across a second dimension.

9. The wavelength beam combiner of claim 7, wherein at least two of the beam emitters have a fixed-position relationship.

10. The wavelength beam combiner of claim 7, further including an optical rotator configured to selectively rotate beams prior to being received by the transform optic.

11. A wavelength beam combining method including:
    selectively rotating electromagnetic beams emitted by a plurality of beam emitters;
    combining the selectively rotated beams along a beam combining dimension;
    redirecting a portion of the combined beams back into the beam emitters; and
    transmitting the combined beams as a single output.

12. The method of claim 11, further including:
individually collimating the emitted beams along a dimension prior to selectively rotating the beams.

13. The method of claim 11, wherein at least two of the beam emitters have a fixed-position relationship.

14. The method of claim 11, wherein all of the beams are rotated in a range of 80 to 90 degrees.

15. A method for wavelength beam combining including:
selectively-repositioning electromagnetic beams emitted by a plurality of beam emitters;
combining the selectively-repositioned beams along a beam combining dimension; and
dispersing the combined beams with a dispersive element; and
redirecting a portion of the dispersed beams back into the beam emitters.

16. The method of claim 15, wherein the plurality of beam emitters produces a two-dimensional profile and the selectively-repositioning step reduces the number of emitted beams along a first dimension while increasing the number of emitted beams across a second dimension.

17. The method of claim 15, wherein an array of periscopes is used in the selectively-repositioning step.

\* \* \* \* \*